(12) United States Patent
Raynham

(10) Patent No.: US 6,654,252 B2
(45) Date of Patent: Nov. 25, 2003

(54) SERVER SYSTEM WITH REMOVABLE SERVER CARTRIDGES

(75) Inventor: Michael B. Raynham, Los Gatos, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 156 days.

(21) Appl. No.: 09/908,375

(22) Filed: Jul. 18, 2001

(65) Prior Publication Data
US 2003/0016504 A1 Jan. 23, 2003

(51) Int. Cl.[7] ................................................. G06F 1/16
(52) U.S. Cl. ..................... 361/727; 361/724; 361/685; 312/223.1; 312/223.2; 364/708.1
(58) Field of Search .................... 361/724–727, 361/685, 687, 692, 695; 364/708.1; 165/101, 137, 121–126; 454/184; 16/225, 227, 254, 260, 261; 439/61, 76, 78, 79, 377, 346, 483; 312/223.1, 223.2, 223.3, 111, 236

(56) References Cited

U.S. PATENT DOCUMENTS

| | | | | |
|---|---|---|---|---|
| 5,486,982 A | * | 1/1996 | Hsu | 361/728 |
| 5,793,610 A | * | 8/1998 | Schmitt et al. | 361/695 |
| 5,971,804 A | * | 10/1999 | Gallagher et al. | 439/581 |
| 6,078,503 A | * | 6/2000 | Gallagher et al. | 361/725 |
| 6,088,224 A | * | 7/2000 | Gallagher et al. | 361/695 |
| 6,115,250 A | * | 9/2000 | Schmitt | 361/695 |
| 6,157,534 A | * | 12/2000 | Gallagher et al. | 361/683 |
| 6,297,962 B1 | * | 10/2001 | Johnson et al. | 361/726 |
| 6,300,847 B1 | * | 10/2001 | Gallagher et al. | 333/33 |
| 6,325,636 B1 | * | 12/2001 | Hipp et al. | 439/61 |
| 6,437,980 B1 | * | 8/2002 | Casebolt | 361/687 |
| 6,483,709 B1 | * | 11/2002 | Layton | 361/724 |
| 6,487,080 B2 | * | 11/2002 | Robbins et al. | 361/727 |
| 6,560,114 B2 | * | 5/2003 | Berry et al. | 361/727 |
| 6,583,989 B1 | * | 6/2003 | Guyer et al. | 361/724 |

FOREIGN PATENT DOCUMENTS

EP          1175136 A2 * 1/2002 .......... H05K/07/20

* cited by examiner

Primary Examiner—Darren Schuberg
Assistant Examiner—Michael Datskovsky

(57) ABSTRACT

A server system includes a cartridge cage including a power supply. The server system includes a plurality of server cartridges. Each server cartridge is configured to be inserted into the cartridge cage and be powered by the cartridge cage power supply. Each server cartridge includes a processor, memory, and a non-volatile storage device. Each server cartridge includes a case substantially surrounding the processor, the memory, and the non-volatile storage device. The server system includes a cooling subsystem positioned between the power supply and the plurality of server cartridges.

23 Claims, 5 Drawing Sheets

SERVER SYSTEM WITH REMOVABLE SERVER CARTRIDGES

THE FIELD OF THE INVENTION

The present invention relates to server systems. More particularly, the invention relates to a server system with removable server cartridges.

BACKGROUND OF THE INVENTION

Server rack space and building floor space are at a cost premium, so it is desirable to obtain a high server density, especially in installations with hundreds or thousands of servers at one site, while also minimizing system cost. It is desirable in a rack-mounted server farm of "front end" servers, such as those commonly used for Internet web sites, to fit as many servers per "U" (i.e., per 1.75 inches of vertical rack space) as possible.

Existing server solutions include low profile servers of 1U size, and low profile board-based servers having multiple cards that plug into a card cage. However, increasing CPU and disk drive power requirements make these two low profile approaches problematic. The increasing power trend requires the use of larger heat sinks and more efficient cooling schemes that are incompatible with the two low profile prior art approaches. A less than optimum cooling scheme can result in lower reliability.

With the two low profile server solutions discussed above, the installation or removal of individual servers is problematic. With the board-based servers, exposed printed circuit assemblies (PCAs) are handled, which could cause electrostatic discharge (ESD) failures. With the low profile servers of 1U size, it is time consuming to slide out one server, and install a second server.

It would be desirable to provide a server system with "hot swappable" server cartridges that may be added and removed from a server system on-line. Hot swappable cartridges have been used before in mass storage systems. For example, a "Starfish" system is a mass storage system that uses plug-in disk drive cartridges. However, hot swappable server cartridges for a server system have not been used. It would be desirable to provide a server system with hot swappable server cartridges, with a higher server density and reliability than current server systems, and without the disadvantages found in many current server systems.

SUMMARY OF THE INVENTION

One form of the present invention provides a server system including a cartridge cage having a power supply. The server system includes a plurality of server cartridges. Each server cartridge is configured to be inserted into the cartridge cage and be powered by the cartridge cage power supply. Each server cartridge includes a processor, memory, and a non-volatile storage device. Each server cartridge includes a case substantially surrounding the processor, the memory, and the non-volatile storage device. The server system includes a cooling subsystem positioned between the power supply and the plurality of server cartridges.

Another form of the present invention provides a server cartridge including a processor, memory coupled to the processor, and a non-volatile storage device coupled to the processor. A server case substantially encompasses the processor, memory, and non-volatile storage device. The cartridge includes an electrical connector for connecting the server cartridge to a backplane of a cartridge cage. The electrical connector is positioned near a back end of the server cartridge. The server cartridge further includes at least one local area network connector positioned near a front end of the server cartridge.

Another form of the present invention provides a server system including a cartridge cage. A plurality of removable power supply modules are configured to be positioned within the cartridge cage near a first end of the cartridge cage. A plurality of removable server cartridges are configured to be positioned within the cartridge cage near a second end of the cartridge cage. Each server cartridge is configured to be powered by one of the power supply modules. Each server cartridge includes a processor, memory, and a non-volatile storage device. A plurality of removable fan modules are configured to be positioned within the cartridge cage between the plurality of power supply modules and the plurality of server cartridges. The cartridge cage includes a backplane positioned substantially near a center of the cage for electrically interconnecting the power supply modules, the server cartridges, and the fan modules.

DESCRIPTION OF THE PREFERRED EMBODIMENTS

In the following detailed description of the preferred embodiments, reference is made to the accompanying drawings that form a part hereof, and in which is shown by way of illustration specific embodiments in which the invention may be practiced. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
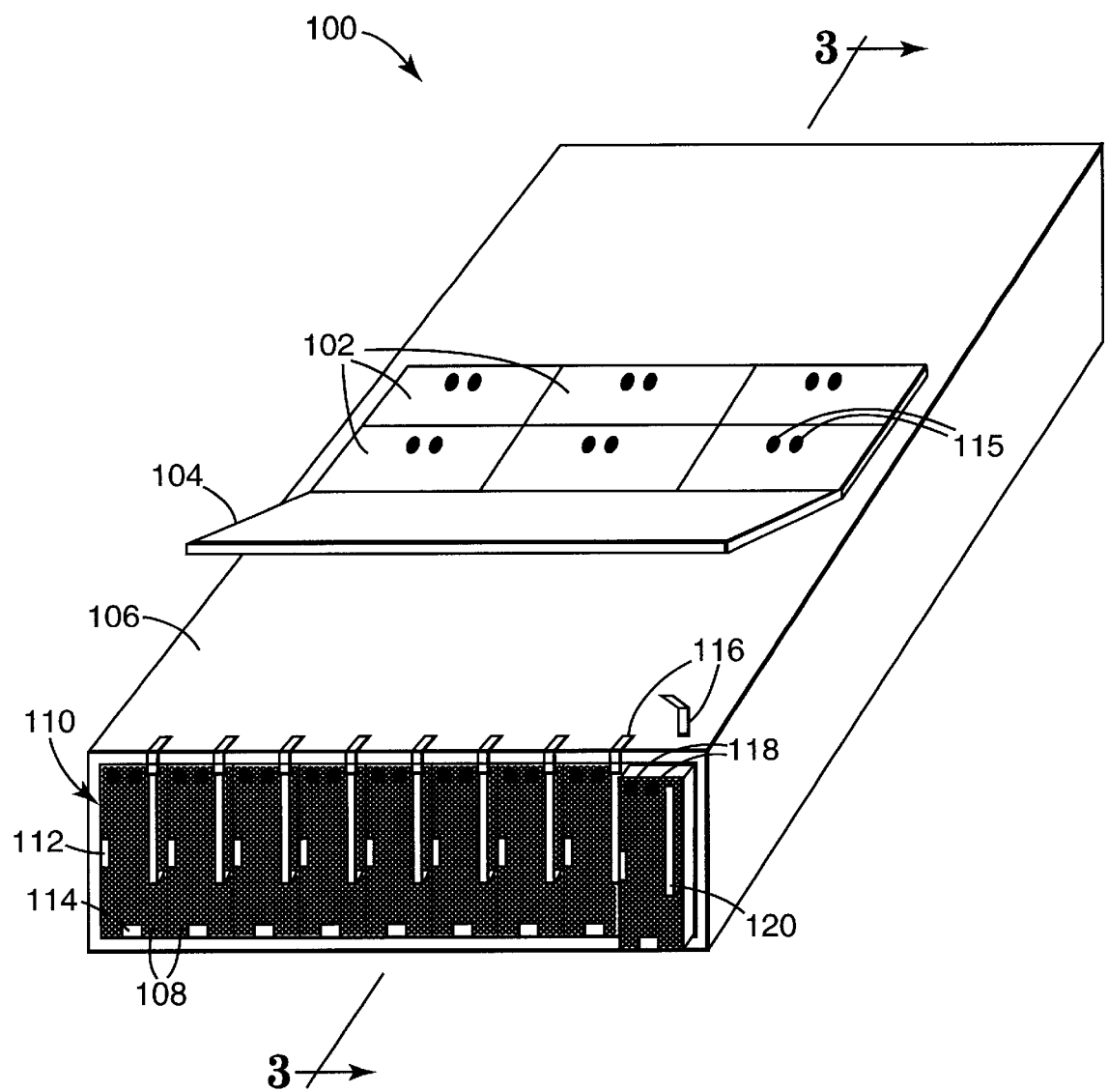
FIG. 1 is a perspective view of a server system according to one embodiment of the present invention.

FIG. 1 is a perspective view of a server system 100 according to one embodiment of the present invention. In one form of the invention, server system 100 is a front-end server system configured as a redundant array of inexpensive servers in network (RAISIN) system. Although only a single server system 100 is shown in FIG. 1, multiple server systems 100 may be positioned together in a rack.

Server system 100 includes six fan modules 102, door 104, cartridge cage 106, nine server cartridges 108, and nine latches 116. Fan modules 102 are positioned near the center of cartridge cage 106, and are removable from cartridge cage 106. In one embodiment, fan modules 102 are hot swappable. Because fan modules 102 are separated from and not contained within server cartridges 108, larger, high efficiency fans can be used. In one embodiment, each fan module 102 includes a 120 mm fan. Door 104 is hinged to cartridge cage 106 and closes to cover fan modules 102. Each fan module 102 includes two light emitting diodes (LEDs) 115. In one embodiment, the left LED 115 on each fan module 102 emits green light when the module 102 is plugged-in and powered on, and emits short bursts or flashes of green light when the fan module 102 receives a server ID command. A server ID command is typically used for servicing of server system 100. In one embodiment, the right LED 115 on each fan module 102 emits green light when the module 102 is operating normally, emits yellow light when the fan module 102 experiences a functional problem (e.g., the fan stalls), and emits red light to indicate a safety issue (e.g., overheating). In one form of the invention, fan modules 102 are configured as an N+1 redundant cooling system for each group of 3 server cartridges 108, where N represents the number of fan modules 102 needed for normal operation for each group of 3 server cartridges, and "1" represents the number of redundant fan modules 102 for each group of 3 server cartridges. In one embodiment, N=1, so there is one fan module 102 for normal operation and one redundant fan module 102 for each group of 3 server cartridges 108.

Server cartridges 108 are positioned near a front portion of cartridge cage 106 and are removable from cartridge cage 106. In one form of the invention, each server cartridge 108 is "hot-swappable" and may be inserted and removed on-line without turning off the power. In one embodiment, each server cartridge 108 is configured as a server appliance, and is not a general purpose server. In one embodiment, each server cartridge 108 is encased in a metal box, with a front end and back end of the metal box substantially covered with vent holes 110. Each server cartridge 108 includes a handle 120 to facilitate insertion and removal of the server cartridge 108 from cartridge cage 106. In FIG. 1, the server cartridge 108 positioned farthest to the right in cartridge cage 106 is shown partially removed. Latches 116 are hinged to cartridge cage 106 and may be pushed down over handles 120 to hold server cartridges 108 in place after insertion into cartridge cage 106. In one form of the invention, latches 116 are positioned horizontally, rather than vertically, so multiple server systems 100 may be stacked on top of each other without interfering with the operation of latches 116. In one embodiment, fan modules 102 and power supply modules 200 (shown in FIG. 2) also include handles 120 like those shown for server cartridges 108 to facilitate insertion and removal of the fan modules 102 and power supply modules 200. And cartridge cage 106 includes additional latches 116 to hold fan modules 102 and power supply modules 200 in place after insertion into cartridge cage 106.

Each server cartridge 108 includes two local area network (LAN) ports 112 and 114, and two LEDs 118. In one embodiment, LAN port 112 is configured for a 1000 Base T LAN, and LAN port 114 is configured for a 100 Base T LAN. In alternative embodiments, LAN ports 112 and 114 may be configured for 10/100/1000 Base T, Infiniband, or other type of network currently existing, or to be developed. In one form of the invention, LAN ports 112 are redundant. In one embodiment, the left LED 118 on each server cartridge 108 emits green light when the cartridge 108 is plugged-in and powered on, and emits short bursts or flashes of green light when the cartridge 108 receives a server ID command. A server ID command is typically used for servicing of server system 100. In one embodiment, the right LED 118 on each server cartridge 108 emits green light when the cartridge 108 is operating normally, emits yellow light when the cartridge 108 experiences a functional problem, and emits red light to indicate a safety issue (e.g., overheating).

In one form of the invention, server cartridges 108 are configured as an N+M redundant server system, where N represents the number of server cartridges 108 needed for normal operation, and M represents the number of redundant server cartridges 108. In one embodiment, N=8 for a single cartridge cage 106, N=143 for a rack, and M=1 for a single cartridge cage 106, although alternative embodiments use more than one spare server cartridge 108 per cage 106.

In one embodiment, cartridge cage 106 is about 24 inches long, 18.25 inches wide, and 5.25 inches high (i.e., 3U), and each server cartridge 108 is about 13.5 inches long, 2 inches wide, and 5 inches high. In alternative embodiments, cartridge cage 106 is between about 22–26 inches long, 16–20 inches wide, and 4–6 inches high, and each server cartridge 108 is between about 12–15 inches long, 1.75–3.5 inches wide, and 4–6 inches high. In alternative embodiments, other dimensions and configurations are used, including a cartridge cage 106 configured to hold more or less than 9 server cartridges 108. With 6 to 12 server cartridges 108 per 3U, the effective server U ranges between 0.25U and 0.5U.

Figure 2:
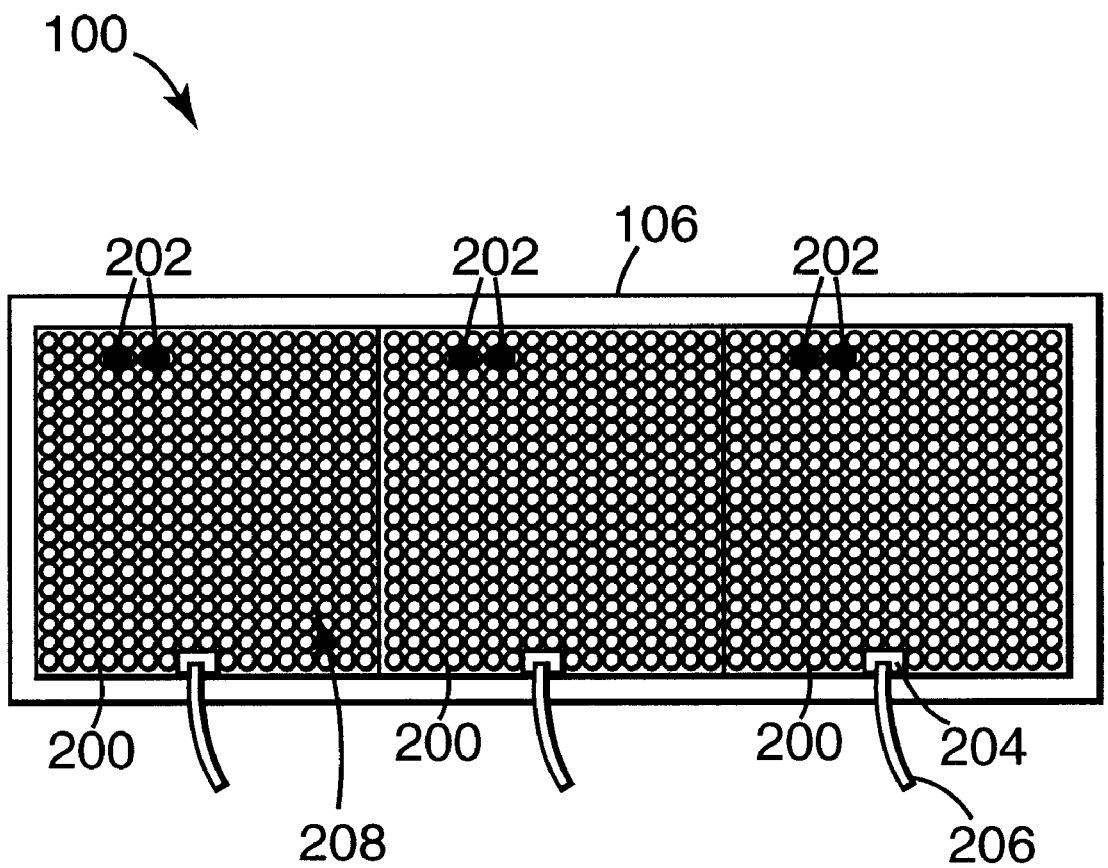
FIG. 2 is a back view of the server system shown in FIG. 1.

FIG. 2 is a back view of the server system 100 shown in FIG. 1. As shown in FIG. 2, three hot swappable power supply modules 200 are positioned near a back portion of cartridge cage 106. In one embodiment, each power supply module 200 is encased in a metal box, with the ends of the metal box substantially covered with vent holes 208. Each power supply module 200 includes a pair of LEDs 202, and a power connector 204. Power cables 206 are plugged into power connectors 204. In one embodiment, power supply modules 200 are configured as an N+1 redundant power system, where N represents the number of power supply modules 200 needed for normal operation, and "1" represents the number of redundant power supply modules 200. In one form of the invention, N=2, so there are two power supply modules 200 for normal operation, and one redundant power supply module 200, to supply power to server cartridges 108 in cartridge cage 106. In one embodiment, the power supply per 6–9 server cartridges 108 uses only 2–3 power cords, rather than one power cord for each server cartridge 108. By powering multiple server cartridges 108 with a single power supply module 200, larger, less expensive, and lower power density supply modules may be used.

In one embodiment, the left LED 202 on each supply module 200 emits green light when the module 200 is plugged-in and powered on, and emits short bursts or flashes of green light when the supply module 200 receives a server ID command. A server ID command is typically used for servicing of server system 100. In one embodiment, the right LED 202 on each supply module 200 emits green light when the module 200 is operating normally, emits yellow light when the module 200 experiences a functional problem, and emits red light to indicate a safety issue (e.g., overheating).

Figure 3:
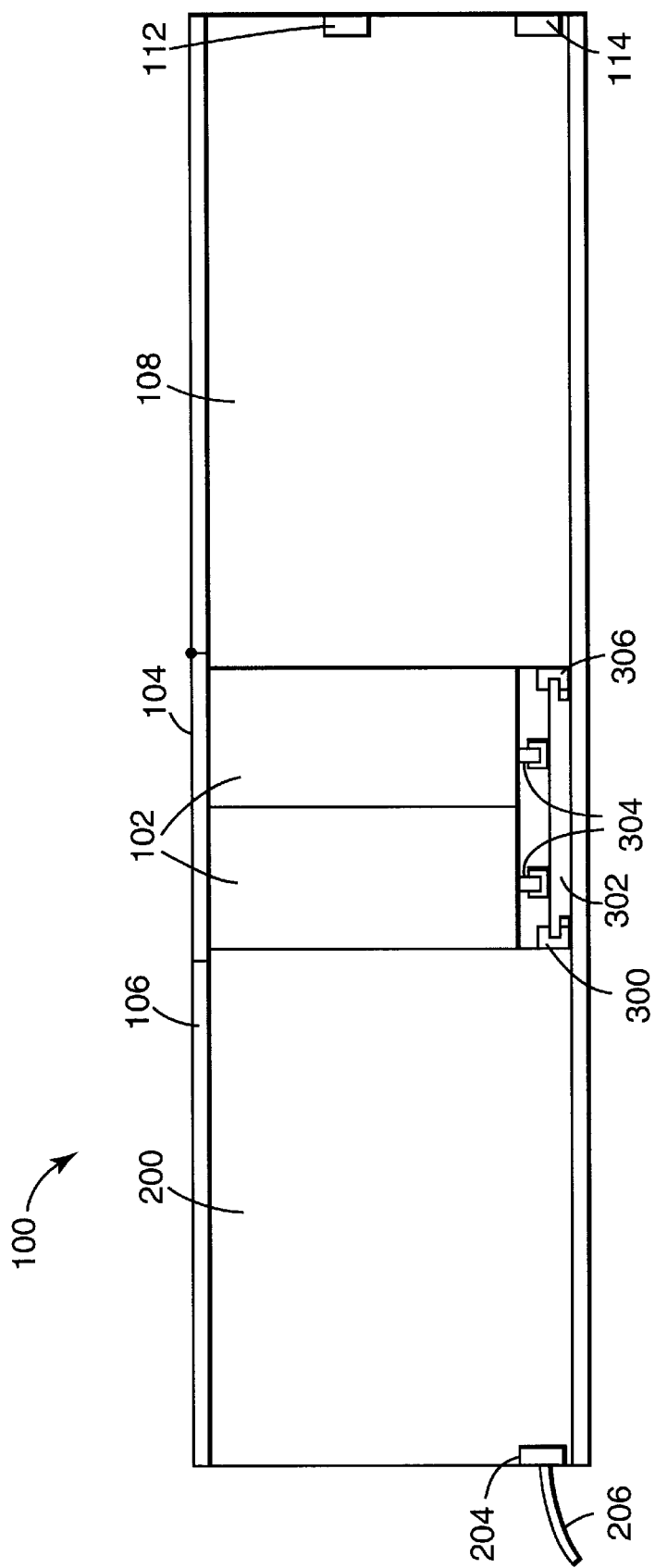
FIG. 3 is a cross-sectional view of the server system shown in FIG. 1 taken along section lines 3—3.

FIG. 3 is a cross-sectional view of the server system 100 shown in FIG. 1 taken along section lines 3—3. Back plane 302 is attached to cartridge cage 106. Each power supply module 200 is connected to back plane 302 via a connector 300. Fan modules 102 are connected to back plane 302 via connectors 304. Each server cartridge 108 is connected to back plane 302 via a connector 306. In one embodiment, each connector 300, 304, and 306 is a low insertion force connector with a low accuracy requirement. In one form of the invention, server system 100 is reversible, so that server cartridges 108 are positioned at the back of server system 100, and power supply modules 200 are positioned at the front of server system 100. In one embodiment, air flows through server system 100 from front to back (i.e., from right to left in FIG. 3), regardless of the positioning of server cartridges 108 and power supply modules 200.

Figure 4:
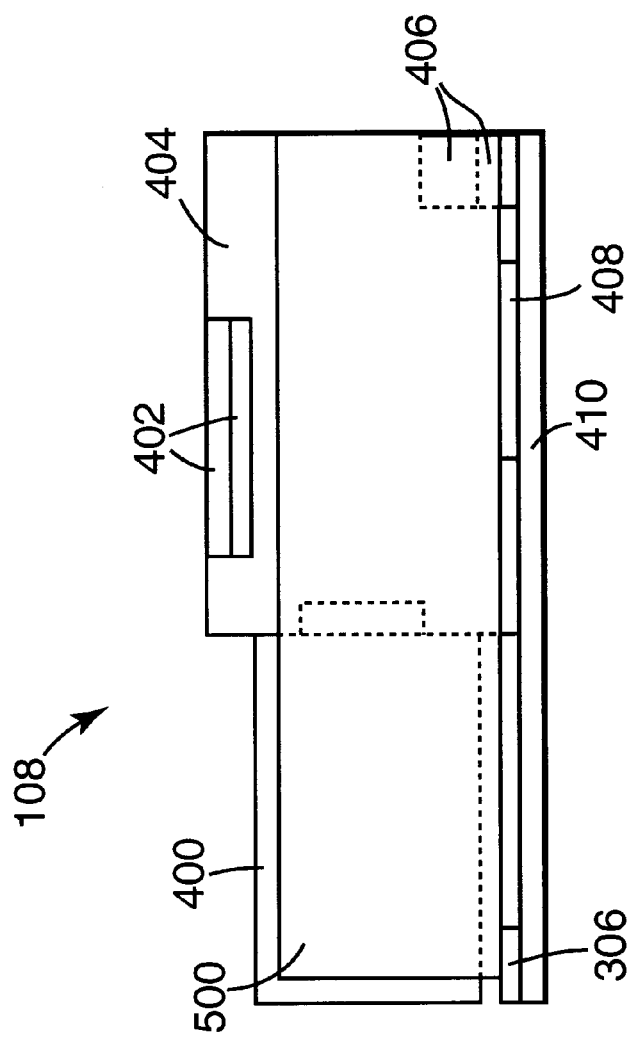
FIG. 4 is a side view illustrating a simplified representation of major internal components of a server cartridge according to one embodiment of the present invention.

FIG. 4 is a side view illustrating a simplified representation of major internal components of a server cartridge 108 according to one embodiment of the present invention. In FIG. 4, the metal box encasing server cartridge 108 has been removed to illustrate the internal components. Server cartridge 108 includes hard disk drive 400, dual in-line memory modules (DIMMs) 402, processor board 404, LAN circuitry 406, PCI slot 408, circuit board 410, and connector 306. DIMMs 402 and hard disk drive 400 are mounted on processor board 404. Processor board 404, LAN circuitry 406, PCI slot 408, and connector 306 are mounted on circuit board 410. In one embodiment, processor board 404 includes processor 600 (shown in FIG. 6), and a heat sink (not shown). In one form of the invention, hard disk drive 400 is a dual hard disk drive for redundancy.

Figure 5:
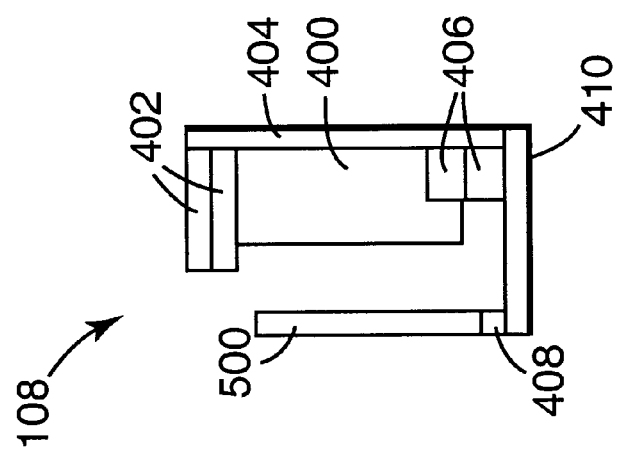
FIG. 5 is a front view illustrating a simplified representation of major internal components of a server cartridge according to one embodiment of the present invention.

FIG. 5 is a front view illustrating a simplified representation of major internal components of a server cartridge 108 according to one embodiment of the present invention. As shown in FIG. 5, PCI card 500 is inserted in PCI slot 408. In one embodiment, PCI card 500 is a 1000 Base T LAN card and is coupled to LAN port 112 (shown in FIG. 1). In one form of the invention, LAN circuitry 406 is configured for a 100 Base T LAN, and is coupled to LAN port 114 (shown in FIG. 1). In one embodiment, connector 306 includes connections for power and a management bus.

Figure 6:
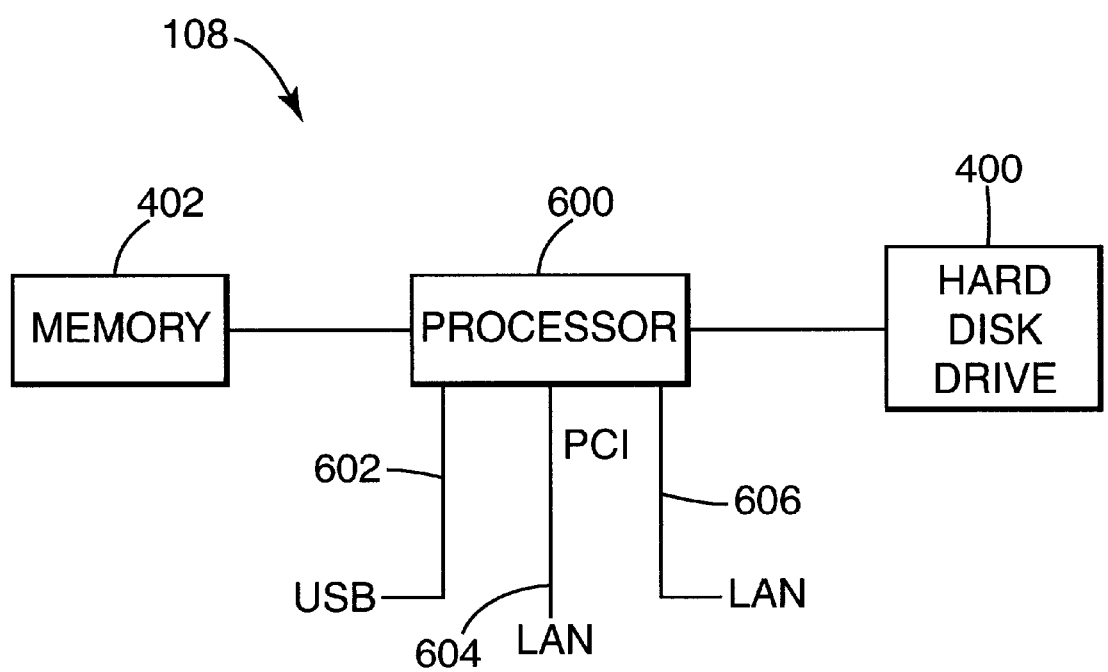
FIG. 6 is an electrical block diagram illustrating major components of a server cartridge according to one embodiment of the present invention.

FIG. 6 is an electrical block diagram illustrating major components of a server cartridge 108 according to one embodiment of the present invention. Server cartridge 108 includes memory 402, processor 600, hard disk drive 400, USB link 602, PCI bus 604, and LAN link 606. In one embodiment, memory 402 includes 2 double data rate (DDR) ECC memory modules. In one embodiment, USB link 602 is used for debugging of server cartridge 108. In one form of the invention, hard disk drive 400 is coupled to processor 600 by a SCSI link. Processor 600 is coupled to PCI slot 408 (shown in FIGS. 4 and 5) via PCI bus 604, and communicates with PCI card 500 over PCI bus 604. Processor 600 is coupled to LAN circuitry 406 (shown in FIGS. 4 and 5) by LAN link 606 for communication with a LAN. In one form of the invention, processor 600 is a dual processor for redundancy. In one embodiment, LAN link 606 is also coupled to connector 306 (shown in FIG. 4) and is used for server management functions.

In one form of the invention, processor 600 is Intel IA-32 compatible, and server cartridges 108 use a Windows 2000 or Linux operating system with standard input/output drivers. In one embodiment, server cartridges 108 use standard PC server components, such as ECC memory, SCSI hard drives, PCI cards, chipsets, connectors, and other components.

Embodiments of the present invention provide a high server density, with high reliability, and faster server installation and removal times than current systems. In one embodiment, an entire server can be replaced in less than one minute. Embodiments of the present invention have an effective size of less than 0.5U. Embodiments of the present invention are particularly useful in server farm applications where hundreds or thousands of servers are required at one site.

Embodiments of the present invention provide efficient cooling for higher power, next generation CPU's, and a minimized number of electrical connector contacts, which translates into higher reliability. In one embodiment, server cartridges 108 and cartridge cage 106 do not contain any interconnect cables, which increases system reliability.

Embodiments of the present invention provide approximately twice the server density of existing board server systems, and have a more robust package, and less stringent alignment requirements than existing board server systems. Unlike board server systems, handling of server cartridges 108 in embodiments of the present invention will not induce ESD failures. Further, swapping of server cartridges 108 in embodiments of the present invention can be performed by a robot or other automated control system that can traverse the front or the rear of a large rack, which is not practical with board servers.

Although specific embodiments have been illustrated and described herein for purposes of description of the preferred embodiment, it will be appreciated by those of ordinary skill in the art that a wide variety of alternate and/or equivalent implementations may be substituted for the specific embodiments shown and described without departing from the scope of the present invention. Those with skill in the chemical, mechanical, electromechanical, electrical, and computer arts will readily appreciate that the present invention may be implemented in a very wide variety of embodiments. This application is intended to cover any adaptations or variations of the preferred embodiments discussed herein. Therefore, it is manifestly intended that this invention be limited only by the claims and the equivalents thereof.

What is claimed is:

1. A server system comprising:
   a cartridge cage including a power supply;
   a plurality of server cartridges, each server cartridge configured to be inserted into the cartridge cage and be powered by the cartridge cage power supply, each server cartridge including a processor, memory, and a non-volatile storage device, each server cartridge including a case substantially surrounding the processor, the memory, and the non-volatile storage device; and
   a cooling subsystem positioned between the power supply and the plurality of server cartridges.

2. The server system of claim 1, wherein each server cartridge includes a first local area network connector.

3. The server system of claim 2, wherein each server cartridge includes a second local area network connector.

4. The server system of claim 1, wherein the power supply includes a plurality of supply modules configured to be removed from the cartridge cage.

5. The server system of claim 4, wherein the number of supply modules is less than the number of server cartridges.

6. The server system of claim 1, wherein the server cartridges are configured to be added and removed without turning off power to the server system.

7. The server system of claim 1, wherein the memory includes at least one dual in-line memory module.

8. The server system of claim 1, wherein the non-volatile storage device is a hard disk drive.

9. The server system of claim 1, wherein the cooling subsystem includes a plurality of removable fans.

10. The server system of claim 9, wherein the fans are 120 mm fans.

11. The server system of claim 9, and further comprising a door hinged to the cartridge cage for covering the plurality of removable fans.

12. The server system of claim 1, wherein each server cartridge is encased in a metal box.

13. The server system of claim 1, wherein each server cartridge includes a handle to facilitate insertion and removal of the server cartridge from the cartridge cage.

14. The server system of claim 1, wherein each server cartridge has a length of between about 12–15 inches, a width of between about 1.75 to 3.5 inches, and a height of between about 4–6 inches.

15. The server system of claim 14, wherein the cartridge cage has a length of between about 22–26 inches, a width of between about 16–20 inches, and a height of between about 4–6 inches.

16. A server cartridge comprising:

a processor;

memory coupled to the processor;

a non-volatile storage device coupled to the processor;

a server case substantially encompassing the processor, memory, and non-volatile storage device;

an electrical connector for connecting the server cartridge to a backplane of a cartridge cage; and wherein the electrical connector is positioned near a back end of the server cartridge, the server cartridge further comprising at least one local area network connector positioned near a front end of the server cartridge.

17. The server cartridge of claim 16, wherein the server cartridge is configured to be added to and removed from the cartridge cage without turning off power to the cartridge cage.

18. The server cartridge of claim 16, wherein the memory includes at least one dual in-line memory module.

19. The server cartridge of claim 16, wherein the non-volatile storage device is a hard disk drive.

20. The server cartridge of claim 16, wherein the server case is a metal box.

21. The server cartridge of claim 16, and further comprising a handle to facilitate insertion and removal of the server cartridge from the cartridge cage.

22. The server cartridge of claim 16, wherein the server cartridge has a length of between about 12–15 inches, a width of between about 1.75 to 3.5 inches, and a height of between about 4–6 inches.

23. A server system comprising:

a cartridge cage;

a plurality of removable power supply modules configured to be positioned within the cartridge cage near a first end of the cartridge cage;

a plurality of removable server cartridges configured to be positioned within the cartridge cage near a second end of the cartridge cage, each server cartridge configured to be powered by one of the power supply modules, each server cartridge including a processor, memory, and a non-volatile storage device;

a plurality of removable fan modules configured to be positioned within the cartridge cage between the plurality of power supply modules and the plurality of server cartridges; and wherein the cartridge cage includes a backplane positioned substantially near a center of the cage for electrically interconnecting the power supply modules, the server cartridges, and the fan modules.

* * * * *